(12) United States Patent
Nguyen et al.

(10) Patent No.: US 9,500,416 B2
(45) Date of Patent: Nov. 22, 2016

(54) THERMAL MANAGEMENT DEVICE AND METHOD FOR MAKING THE SAME

(75) Inventors: Sean Nguyen, Fullerton, CA (US);
Gary L. Duncan, Torrance, CA (US);
Bruce L. Drolen, Altadena, CA (US);
David M. Bowden, Manchester, MO (US)

(73) Assignee: THE BOEING COMPANY, Chicago, IL (US)

( * ) Notice: Subject to any disclaimer, the term of this patent is extended or adjusted under 35 U.S.C. 154(b) by 332 days.

(21) Appl. No.: 12/131,081

(22) Filed: May 31, 2008

(65) Prior Publication Data

US 2009/0296345 A1 Dec. 3, 2009

(51) Int. Cl.
*H05K 7/20* (2006.01)
*F28F 3/12* (2006.01)
*B32B 37/00* (2006.01)
*F28F 1/40* (2006.01)
*F28F 7/02* (2006.01)
*F28F 13/00* (2006.01)
*F28F 21/08* (2006.01)
*F28F 3/02* (2006.01)

(52) U.S. Cl.
CPC .............. *F28F 3/12* (2013.01); *B32B 37/00* (2013.01); *F28F 1/40* (2013.01); *F28F 3/02* (2013.01); *F28F 7/02* (2013.01); *F28F 13/00* (2013.01); *F28F 21/08* (2013.01); *H05K 7/20545* (2013.01); *B32B 2310/028* (2013.01); *B32B 2311/00* (2013.01); *H01L 2924/0002* (2013.01)

(58) Field of Classification Search
USPC .................................................. 361/688–722
See application file for complete search history.

(56) References Cited

U.S. PATENT DOCUMENTS

| | | | |
|---|---|---|---|
| 4,843,693 A * | 7/1989 | Chisholm ................ 29/890.054 |
| 4,898,234 A * | 2/1990 | McGovern et al. .......... 165/170 |
| 5,205,353 A * | 4/1993 | Willemsen et al. .......... 165/170 |
| 6,143,378 A | 11/2000 | Harwell et al. |
| 6,151,215 A * | 11/2000 | Hoffman ...................... 361/704 |
| 6,205,022 B1 * | 3/2001 | Bhatia et al. ............ 361/679.52 |
| 6,443,352 B1 | 9/2002 | White |
| 6,457,629 B1 | 10/2002 | White |
| 6,463,349 B2 | 10/2002 | White et al. |
| 6,519,500 B1 | 2/2003 | White |

(Continued)

FOREIGN PATENT DOCUMENTS

EP 2131640 A1 12/2009
JP S63124599 A 5/1988

(Continued)

OTHER PUBLICATIONS

State Intellectual Property Office of PRC Notification of First Office Action and English Translation, issued Apr. 2, 2013, regarding Application No. 200910138282.0, 13 pages.

(Continued)

*Primary Examiner* — Courtney Smith
(74) *Attorney, Agent, or Firm* — Yee & Associates, P.C.

(57) ABSTRACT

A thermal management device suitable for use as an electronic chassis includes a monolithic, monocoque body having integrally formed channels for carrying thermal energy away from a heat source, such as electronic components. The device may be fabricated using additive/subtractive manufacturing processes such as ultrasonic consolidation.

18 Claims, 9 Drawing Sheets

(56) References Cited

U.S. PATENT DOCUMENTS

| | | | |
|---|---|---|---|
| 6,685,365 B2 | 2/2004 | White | |
| 6,725,910 B2 * | 4/2004 | Ishida et al. | 165/104.26 |
| 6,754,121 B2 | 6/2004 | Worley | |
| 6,814,823 B1 | 11/2004 | White | |
| 6,819,561 B2 | 11/2004 | Hartzell et al. | |
| 6,994,151 B2 | 2/2006 | Zhou et al. | |
| 7,032,652 B2 * | 4/2006 | Wang et al. | 165/104.26 |
| 7,244,323 B2 | 7/2007 | White et al. | |
| 7,309,400 B2 | 12/2007 | White | |
| 7,602,610 B2 | 10/2009 | Ueda | |
| 7,911,794 B2 * | 3/2011 | Hasegawa | 361/700 |
| 2004/0104012 A1 | 6/2004 | Zhou et al. | 165/104.26 |
| 2006/0146496 A1 | 7/2006 | Asfia et al. | |
| 2008/0087406 A1 * | 4/2008 | Asfia | F28D 15/0233 165/104.29 |
| 2008/0123263 A1 * | 5/2008 | Ueda | 361/680 |
| 2008/0190587 A1 | 8/2008 | Lin et al. | |
| 2009/0116183 A1 * | 5/2009 | Mundt | 361/679.46 |

FOREIGN PATENT DOCUMENTS

| | | |
|---|---|---|
| JP | H11121668 A | 4/1999 |
| JP | 2004069234 A | 3/2004 |
| JP | 2006041025 A | 2/2006 |
| JP | 2007030419 A | 2/2007 |
| JP | 2007212028 A | 8/2007 |
| JP | 3136735 U | 11/2007 |
| JP | 2008527709 A | 7/2008 |
| KR | 100191984 B1 | 6/1999 |
| KR | 20070120251 A | 12/2007 |
| WO | WO9110560 A1 | 7/1991 |

OTHER PUBLICATIONS

State Intellectual Property Office of PRC Notification of Second Office Action and English Translation, issued Aug. 28, 2013, regarding Application No. 200910138282.0, 13 pages.

State Intellectual Property Office of PRC Notification of Third Office Action and English Translation, issued Jan. 17, 2014, regarding Application No. 200910138282.0, 9 pages.

State Intellectual Property Office of PRC Notification of Fourth Office Action and English Translation, issued May 26, 2014, regarding Application No. 200910138282.0, 5 pages.

Notice of Reasons for Rejection and English Translation, issued Jul. 2, 2013, regarding Japanese Patent Application No. 2009-131685, 7 pages.

Decision of Rejection and English Translation, issued Mar. 25, 2014, regarding Japanese Patent Application No. 2009-131685, 3 pages.

Preliminary Examination Report and English Translation, dated Aug. 11, 2014, regarding Japanese Patent Application No. 2009-131685, 3 pages.

Notice of Reasons for Rejection and English Translation, issued Jul. 21, 2015, regarding Japanese Patent Application 2009-131685, 4 pages.

Korean Intellectual Property Office Notice of Office Action and English Translation, dated Nov. 27, 2015, regarding Application No. 10-2009-0042937, 14 pages.

European Patent Office Communication, dated Jun. 30, 2016, regarding Application No. EP09161606.0, 4 pages.

* cited by examiner

THERMAL MANAGEMENT DEVICE AND METHOD FOR MAKING THE SAME

TECHNICAL FIELD

This disclosure generally relates to managing thermal energy produced by a heat generating source such as an electronic assembly, and deals more particularly with a device for channeling the thermal energy away from the heat generating source, as well as a method for making the device.

BACKGROUND

A variety of devices have been developed for transferring heat away from thermal energy sources, such as printed circuit boards (PCBs) in order to avoid adversely affecting heat sensitive components. In one form of these devices, discrete heat pipes are assembled between individual metal sheets. Heat generated by electronic components is conducted through the metal sheets to the heat pipes where it is carried away by a flow of heat transfer fluid. Another known device employs a layer of thermally conductive solid material, such as thermally conductive graphite placed between two discrete sheets of material. Component heat is conducted away from the components through the thermally conductive solid layer to either a face of the solid layer, or to the edges of the layer where it may be dissipated.

Existing thermal management devices may require the integration of composite materials and multiple interfaces, often with adhesives therebetween which have higher thermal resistance and may lead to poor heat transfer performance. Also, known thermal management devices may be relatively expensive to manufacture because of the need to assemble and fabricate multiple individual parts, using more than one process. These designs, as well as constraints imposed by existing manufacturing techniques, may limit design flexibility and result in less than optimum performance for some applications. Moreover, the continued trend toward higher circuit densities and smaller component sizes may exacerbate the problem of designing highly efficient thermal management devices.

Accordingly, there is a need for a thermal management device as well as a method for making the device that are highly efficient and have the flexibility to be adapted to a wide range of applications.

SUMMARY

The disclosed embodiments provide a thermal management device comprising a monolithic, thermally conductive body having integrally formed, embedded channels for channeling heat away from a thermal source, such as a PCB. The monolithic construction of the device results in reduced material and assembly labor costs. Further advantages of the disclosed thermal management device reside in its ability to be tailored to a wide range of custom applications requiring unique geometries and configurations.

As a result of monolithic construction of the disclosed thermal management device, thermal resistance is reduced, resulting in improved thermal performance, while significantly reducing manufacturing costs and time. Additionally, the method used to fabricate the thermal management device allows for more complex heat channel configurations which can be used with a wide range of heat exchange technologies, including pulse and conventional capillary technologies. Finally, the disclosed method embodiments allow the fabrication of a device using a single process.

According to one disclosed embodiment, a device for carrying heat away from a heat source comprises a one-piece monolithic body adapted to be placed in contact with a heat source and having at least one embedded channel for channeling heat away from the heat source. In one form, the body may include first and second edges wherein the channel includes first and second portions respectively extending along the first and second edges for channeling the heat from the body to the edges. The channel may include one or more thermal fins integrally formed with the body for enhancing heat transfer from the body to the channel. Multiple channels may be provided in order to increase device reliability and optimize heat transfer capacity.

According to another disclosed embodiment, an electronics chassis having thermal management comprises: a monocoque body adapted to have an electronic assembly mounted thereon and having at least one integrally formed channel therein for carrying heat away from the electronic assembly. The monocoque body may include integrally formed inlet and outlet openings coupled with the channel for directing a flow of a heat exchange fluid into and out of the body. The chassis may further comprise a mounting receptacle for receiving and mounting an edge of the monocoque body.

According to a disclosed method embodiment, fabricating a thermal management device comprises: consolidating multiple layers of a thermally conductive material to form a monolithic body having embedded channels for channeling a flow of thermal energy. Consolidating the multiple layers may include metallurgically bonding together successive layers of metal foil. The metallurgical bonding may be performed by applying ultrasonic energy to the metal foil layers.

According to another method embodiment, producing an electronic assembly having thermal management comprises: forming a monolithic, thermally conductive body having internal, heat carrying channels by consolidating multiple layers of material; and, mounting a heat generating electronic circuit on the conductive body. The metallurgical bonding may be performed by laminating multiple layers of metal foil using ultrasonic or other types of energy.

Other features, benefits and advantages of the disclosed embodiments will become apparent from the following description of embodiments, when viewed in accordance with the attached drawings and appended claims

BRIEF DESCRIPTION OF THE ILLUSTRATIONS

DETAILED DESCRIPTION

Referring first to FIGS. 1-8, the disclosed embodiments generally relate to a thermal management device 30 that includes a monolithic, monocoque body 32 having internal, embedded channels 34. In the embodiment illustrated in FIGS. 1-8, the monolithic body 32 comprises a generally rectangular plate which, as will be discussed below, may be employed as a chassis 32c (see FIG. 13) having broad faces 32d, 32e on which heat generating components (not shown) may be mounted. The monolithic body 32 may be formed from a thermally conductive material using later discussed consolidation or similar processes in which successive layers of material are merged to form a monolithic, one piece body 32, wherein the channels 34 are integrally formed with the body 32. By way of example and not limitation, the body 32 may comprise alloys of one or more of aluminum, copper, manganese, nickel, gold, silver, and titanium.

Figure 1:
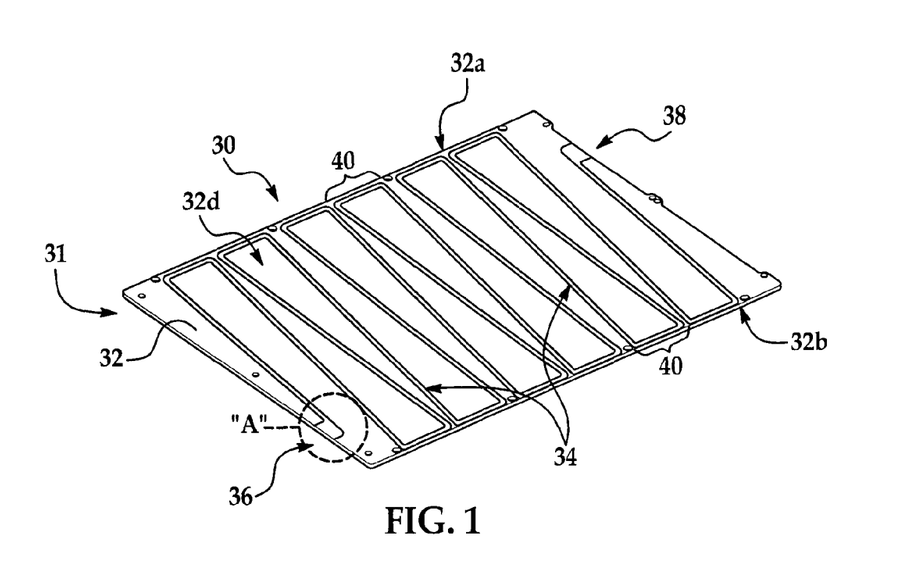
FIG. 1 is a perspective view of a thermal management device.
Figure 2:
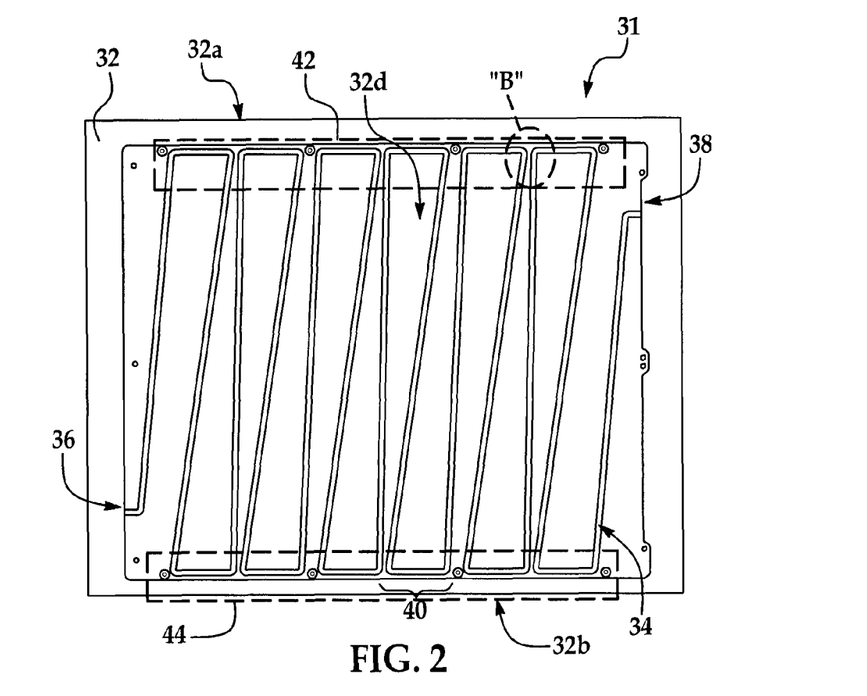
FIG. 2 is a side view of the thermal management device shown in FIG. 1.
Figure 3:
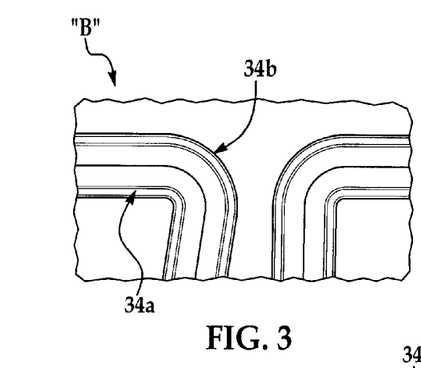
FIG. 3 is an enlarged view of the area designated as "B" in FIG. 2.
Figure 4:
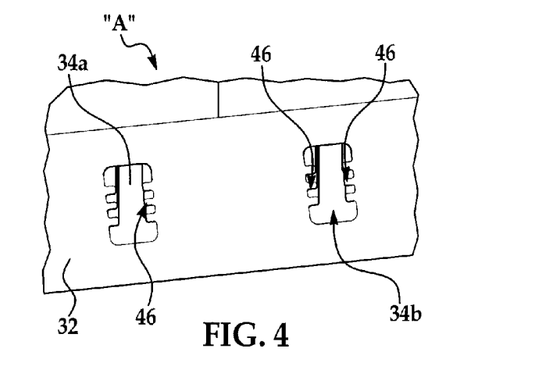
FIG. 4 is an enlarged view of the area designated as "A" in FIG. 1, better illustrating the thermal fins.
Figure 5:
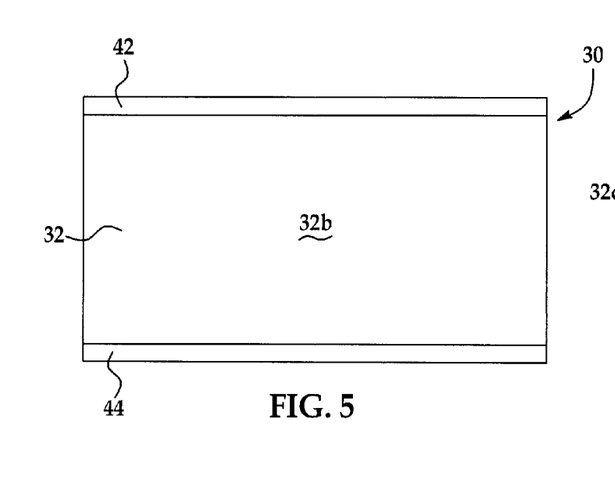
FIG. 5 is a side view of the device shown in FIG. 1 in which two opposite edges are highlighted to designate primary areas of heat transfer.
Figure 6:
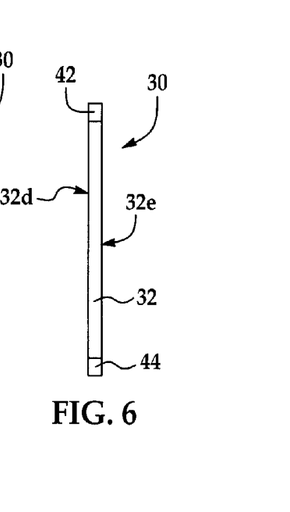
FIG. 6 is an end view of the device shown in FIG. 5.

In the embodiment shown in FIGS. 1-8, the embedded channels 34 form a repeating zigzag pattern across the body 32 in which straight stretches 40 of the channel 34 are axially aligned along opposite edges 32a, 32b of the body 32. As illustrated in FIGS. 2, 5 and 6, the axially aligned stretches 40 of the channels 34 provide linear zones 42, 44 respectively along the edges 32a, 32b where thermal energy may be efficiently extracted from the body 32.

The channels 34 may include an inlet 36, and an outlet 38 that may be coupled with a source and/or drain of a heat exchange fluid which may flow through the channels 34. The thermal management device 30 may be employed in combination with pulse type or capillary action type heat exchange fluid systems (not shown). In the illustrated embodiment, the channels 34 comprise a pair of slightly spaced apart channels 34a, 34b which have substantially the same general lay-out geometry, however a single channel 34 may be satisfactory in a variety of applications. The provision of a pair of channels 34a, 34b of substantially matching geometry provides redundancy that may not only increase the heat dissipation capacity of the device 30, but may also increase reliability in the event that one of the channels 34a, 34b becomes blocked or exhibits a fluid leak.

Figure 7:
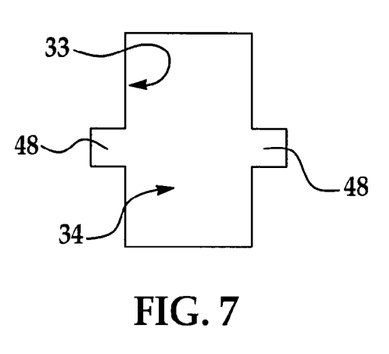
FIG. 7 is a cross sectional view of a channel showing one form of the heat fins.
Figure 8:
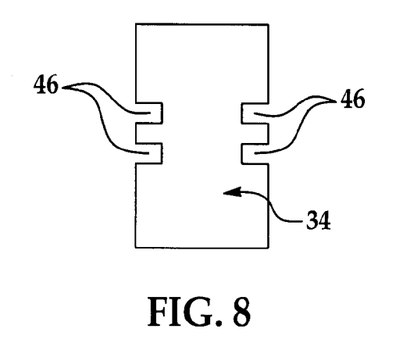
FIG. 8 is a view similar to FIG. 6 but showing an alternate form of the heat fins.

Referring particularly to FIGS. 4, 7 and 8, in accordance with the disclosed embodiments, the monolithic nature of the body 32 and related method of manufacturing the body 32 allows the formation of features within the channels 34 that may increase the heat dissipation capacity of the device 30. For example, thermal fins 46 may be integrally formed with the body 32 that extend into the channels 34, thereby increasing the surface area of the body 32 that surrounds the channel 34. In the illustrated embodiment, the fins 46 are shown as simple ridges having a generally rectangular cross section, however various other geometries are possible. Similarly, as shown in FIG. 7, thermal fins 48 may be formed as grooves in the walls 33 of the channel 34 which, like the thermal fins 46, increase the surface area of the body 32 that is exposed to the heat exchange fluid flowing through channels 34.

Figure 9:
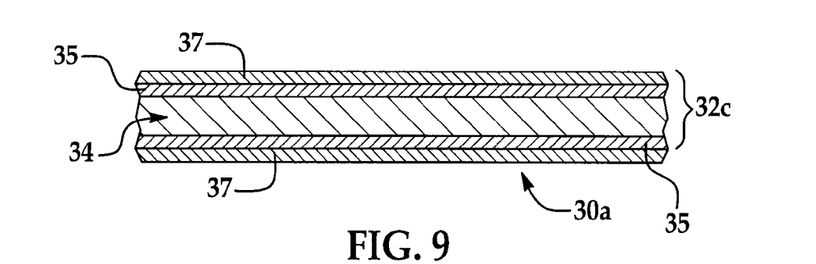
FIG. 9 is a cross sectional view of a portion of a heat management device forming an alternate embodiment.

Referring now to FIG. 9, an alternate embodiment 30a of the thermal management device may include a monolithic body 32c comprising two or more layers of fused, but differing materials. For example, the channels 34 may be formed within a first layer 35 of material that is sandwiched between two outer layers 37 of material which may be the same or different materials. It should be noted here that although layers 35, 37 are shown as having discrete interfacial boundaries, in fact these boundaries may not be distinct since the layers 35, 37 are fused into a monolithic structure, using a consolidation processes that will be discussed below.

Figure 10:
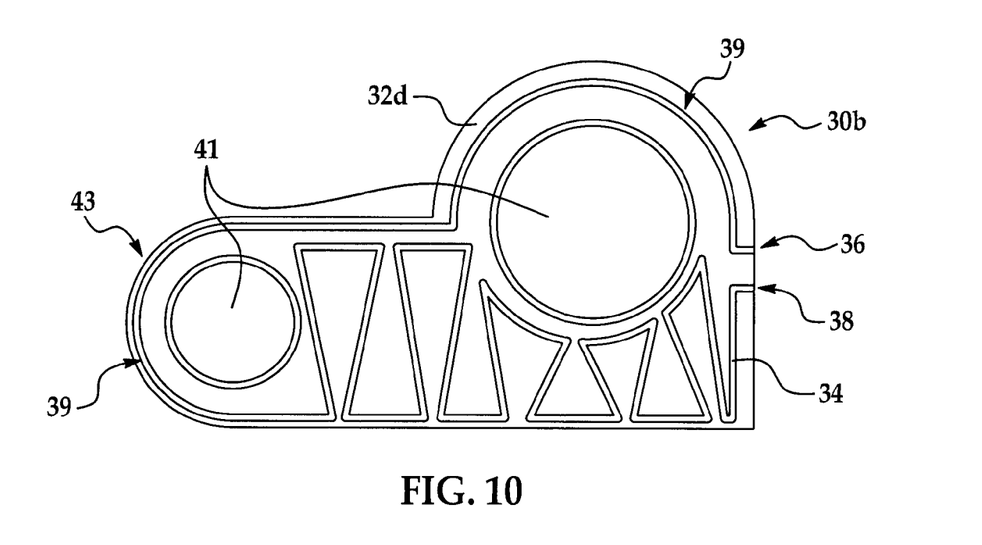
FIG. 10 is a side view of another embodiment of a the heat management device.

FIG. 10 illustrates another embodiment 30b of the thermal management device in which the monolithic body 32d has an irregularly shaped outer periphery 43 and a pair of circular openings 41 therein. In this example, the channels 34 have an irregularly shaped layout geometry and include arcuate sections 39 that substantially follow the periphery of the holes 41. The channels 34 may include an inlet 36 and outlet 38 to allow the flow of a thermal fluid to a pump or heat exchanger (not shown).

Figure 11:
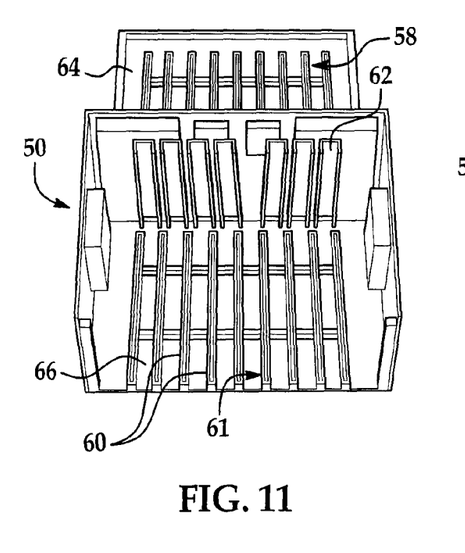
FIG. 11 is an isometric view of an electronic assembly unit having the top and printed wiring board (PWB) slices removed to better illustrate mounting receptacles.
Figure 12:
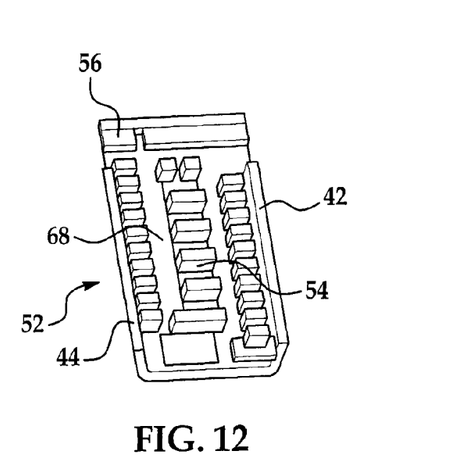
FIG. 12 is a perspective view of a PWB slice employing the thermal management device.
Figure 13:
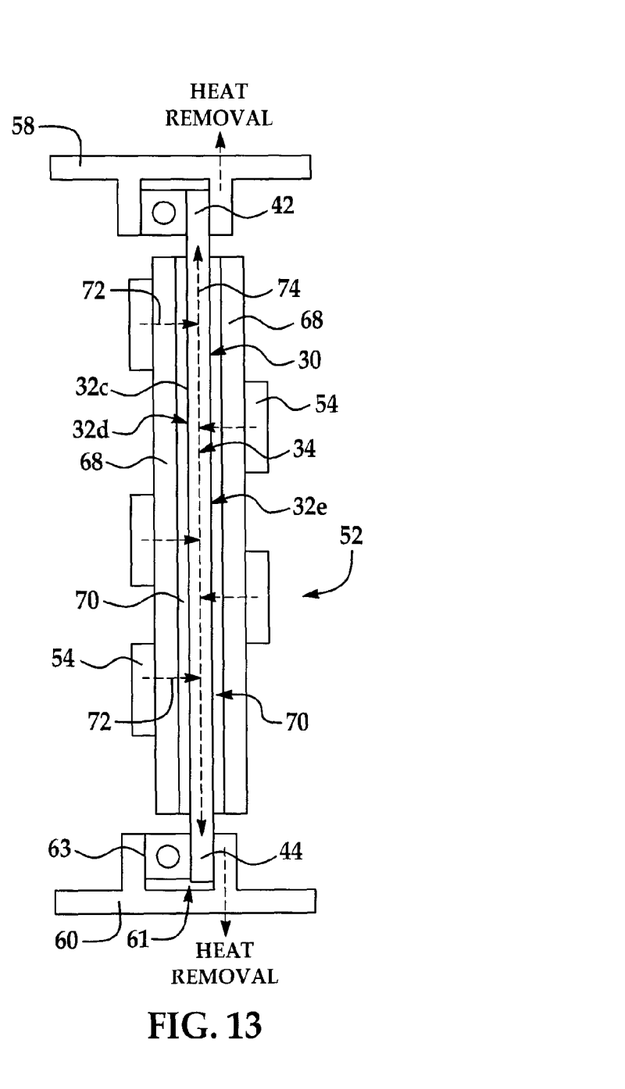
FIG. 13 is a cross sectional view showing the PWB slice of FIG. 12 held in the mounting receptacles shown in FIG. 11.

Reference is now made to FIGS. 11-13 which illustrate one application of the thermal management device 30 described above. In this application, the thermal management device 30 illustrated in FIGS. 1-8 may be employed as a monocoque chassis 32c upon which there may be mounted on opposite faces 32d, 32e of the chassis 32c, printed wiring boards (PWBs) 68. The PWBs 68 may include electronic devices or die 54 mounted on the outer faces 32d, 32e thereof. The PWBs 68 may be fastened to the chassis 32c by means of a layer 70 of thermally conductive bonding adhesive. Alternatively, electronic devices 54 may be directly bonded to the faces 32d, 32e of the chassis 32c.

The assembly of the chassis 32c and the PWBs 68 form a subassembly "slice" 52. A number of the slices 52 may be contained within an electronic unit 50. Each of the slices 52 may include a connector plug 56 that is receivable within corresponding socket 62 on the unit 50 in order to electrically connect the PWBs 68 with external circuitry (not shown). The slices 52 are mounted in edge stacked, parallel relationship within the unit 50 by means of top and bottom receptacles 58, 60 which include channels 61 in which the edges 42, 44 of the chassis 32c are received. The receptacles 58, 60 are formed of thermally conductive material and may include releasable wedge locks 63 which hold and lock the edges 42, 44 within the channels 61. Although not illustrated in the drawings, the electronic unit 50 may include exterior cooling fins, heat sinks or other thermal dissipation devices which extract the heat that is generated by the PWBs 68 and conducted through the receptacles 58, 60.

As best seen in FIG. 13, heat generated by the devices 54 flows in the direction of the dotted lines 72, 74 through the thermally conductive layer 70 of adhesive, and thence into the body of the chassis 32c where it is carried to the receptacles 58, 60 by means of the fluid channels 34 (see FIGS. 1 and 2). Although not illustrated in the drawings, the receptacles 58, 60 may include conduits connecting the inlets and outlets 36, 38 of the chassis 32c with a heat exchanger (not shown) to which a heat exchange fluid may flow in a loop. The type of heat exchange fluid used will depend upon the particular application, and the material chosen for use in fabricating the chassis 32c, however suitable fluids may include, for example and without limitation, methyl alcohol, ethyl alcohol, acetone, kerosene, toluene, ethylene glycol, water and others.

Figure 14:
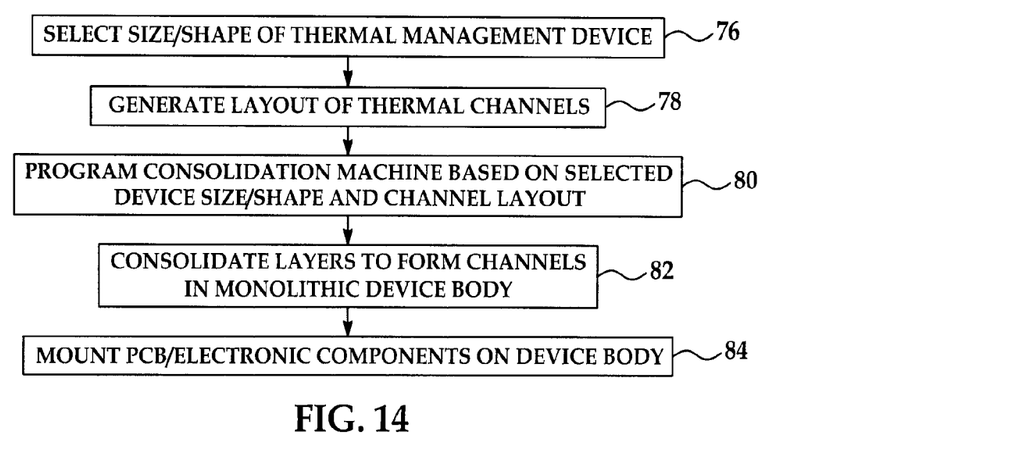
FIG. 14 is a simplified flow chart illustrating the steps of one method for making the thermal management device.

Attention is now directed to FIG. 14 which shows, in simplified form, one method for fabricating the thermal management device 30 described above. Beginning at 76, the size and shape of the device 30 is selected, following which a layout of the thermal channels 34 is generated, at step 78. Next, at 80, a suitable, later discussed, consolidation machine may be programmed based on a selected device size/shape and channel layout. Then, at 82, layers of a suitable material, such as, without limitation, metal foil, are successively consolidated to form the device body 32, including the integrally formed thermal channels 34. As previously described, the channels 34 may include integrally formed thermal fins 46, 48 in order to enhance the thermal dissipation capacity of the device 30. Finally, for those applications where the device 30 is used as an electronic chassis, PCBs, PWBs or other electronic devices or die are mounted directly on the chassis 32c using a thermal adhesive or other means that allow heat transfer from the electronic components to the chassis 32c.

The thermal management device 30 may be fabricated by consolidating successive layers of thermally conductive material using any of several processes known in the art, sometimes referred to as additive/subtractive manufacturing processes. One such suitable process, known as ultrasonic consolidation (UC), uses ultrasonic sound energy to laminate or fuse layers of metal drawn from metal foil stock. Additive/subtractive manufacturing processes such as ultrasonic consolidation, allow the formation of deep slots, hollow, latticed or honeycombed internal structures and other complex geometries that may be difficult to achieve using conventional subtractive machining processes.

Figure 15:
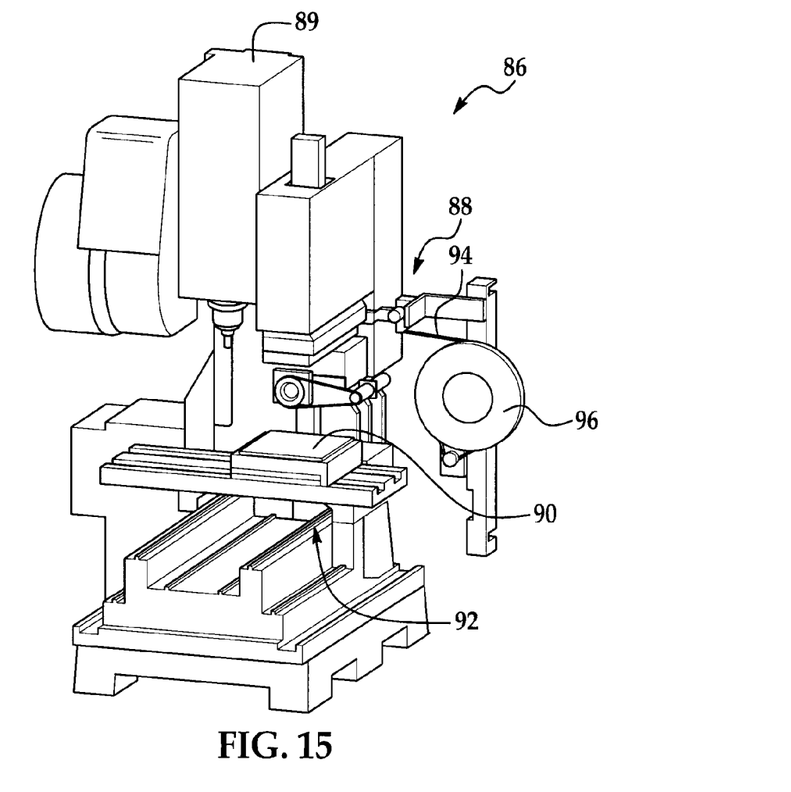
FIG. 15 is a perspective view of an apparatus for fabricating the thermal management device using ultrasonic consolidation.

A typical ultrasonic consolidation machine 86 is illustrated in FIG. 15. An ultrasonic consolidation, deposition module 88 is mounted on a head 89 which may be moveable along multiple axes relative to a base 92 by an NC or CNC controller (not shown). A substrate 90 upon which the device 30 is fabricated is supported on the base 92. Metal foil 94 drawn from a source, such as a supply roll 96 is fed to the deposition module 88.

Figure 16:
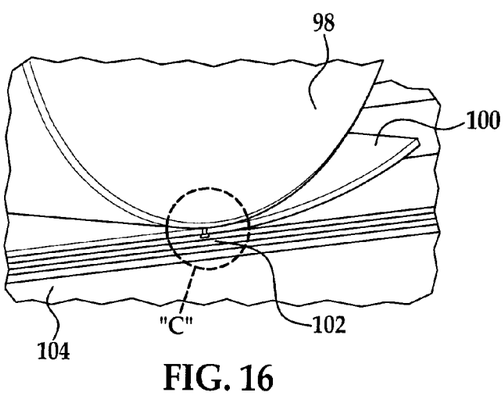
FIG. 16 is a perspective view of a foil layer being laid down and consolidated on a substrate by the machine shown in FIG. 15.
Figure 17:
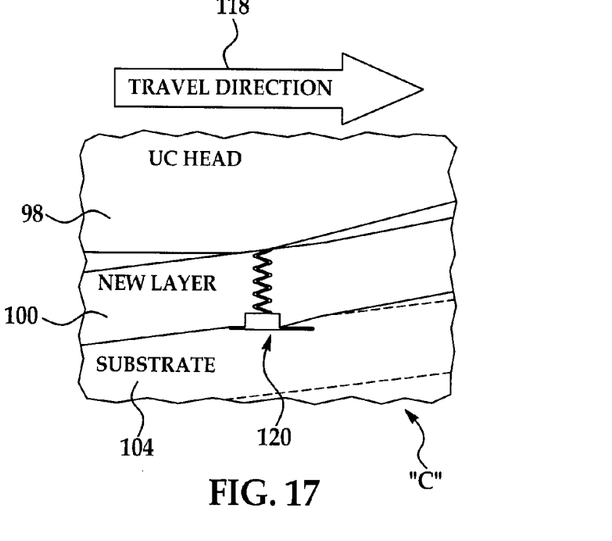
FIG. 17 is an enlarged view of the area designated as "C" in FIG. 16.

As shown in FIGS. 16 and 17, a layer 100 of thin metal foil is deposited over an underlying substrate 104 which may comprise a series of previously consolidated layers 100. The deposition module 88 shown in FIG. 15 includes an ultrasonic head 98 which forces the area of the new layer 100 onto the substrate 104. Rapid excitation of the head 98 produces an instantaneous deformation zone 120 which creates a metallurgical bond between the substrate 104 and the new layer 100. Consecutive layers of the metal foil 94 are metallurgically bonded to each other to produce the monolithic, laminated solid body shown in FIGS. 1 and 2. The channels 34 shown in FIGS. 1 and 2 may be formed by defining the areas over which the ultrasonic head 98 is passed and then trimming, as necessary, each layer 100 as successive layers 100 are consolidated.

Figure 18:
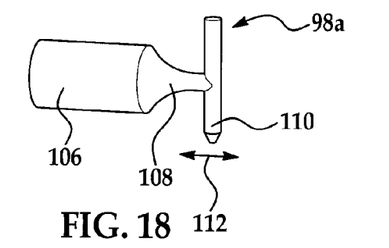
FIG. 18 is a perspective view of one transducer that may be used with the machine shown in FIG. 15.
Figure 19:
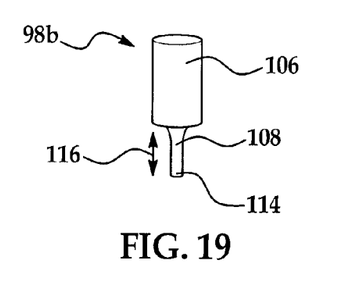
FIG. 19 is a perspective view of another transducer head that may be used with the machine shown in FIG. 15.
Figure 20:
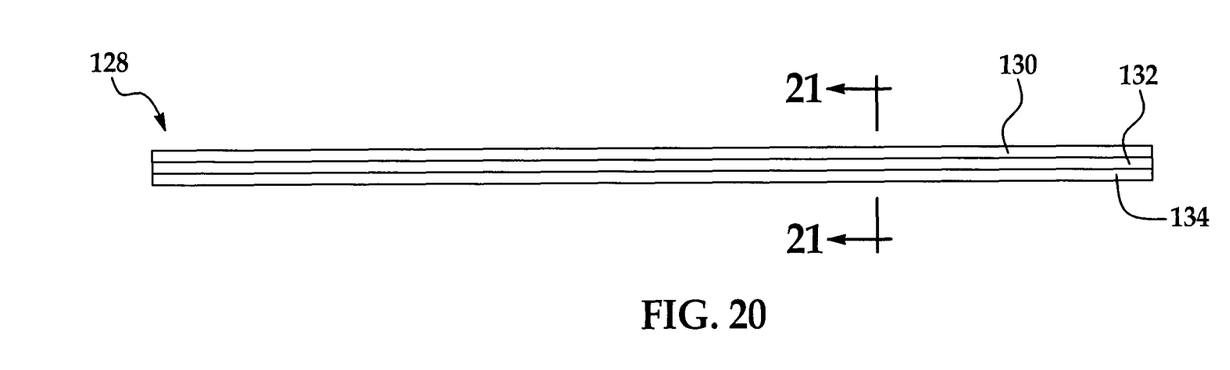
FIG. 20 is a side view of an alternate embodiment of the thermal management device.

FIG. 18 illustrates a typical ultrasonic head 98a which has a pizo device 106 connected to a sonotrode 110 by a booster 108. The sonotrode 110 oscillates rapidly laterally, in the direction of the arrow 112. An alternate form of ultrasonic head 98b is shown in FIG. 19 wherein a pizo 106 drives a combined booster and sonotrode 114 having a tip 114 that bears against the new layer 100 of foil. In the case of the head 98b, the tip 114 oscillates up and down, in the direction of the arrow 116.

It should be again emphasized here that the ultrasonic consolidation process described above is merely illustrative of various additive/subtractive fabrication processes that may be employed to fabricate the monolithic thermal management device 30 such as, for example and without limitation, energetic wire deposition of the type generally described in U.S. Pat. No. 6,143,378.

Attention is now directed to FIGS. 20-23 which illustrate an alternate form of a thermal management device 128 comprising multiple layers 130, 132, 134 of relatively thin metal foil, such as, without limitation, copper foil. The layers 130-134 are sufficiently thin such that the device 128 is somewhat flexible. For example, in one practical application, the layers 130-134 may each be approximately 3 to 5 mils thick.

Figure 21:
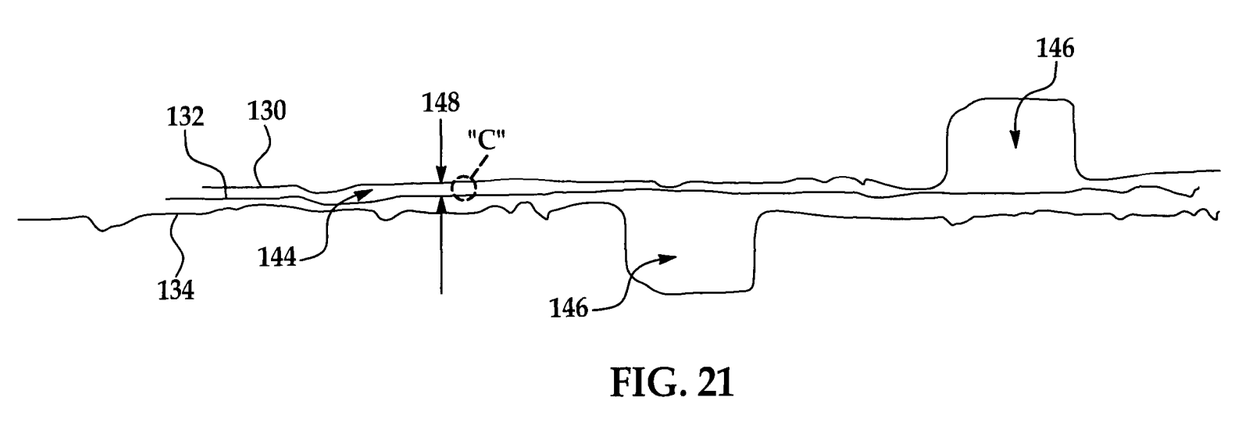
FIG. 21 is a sectional view taken along the line 21-21 in FIG. 20.
Figure 22:
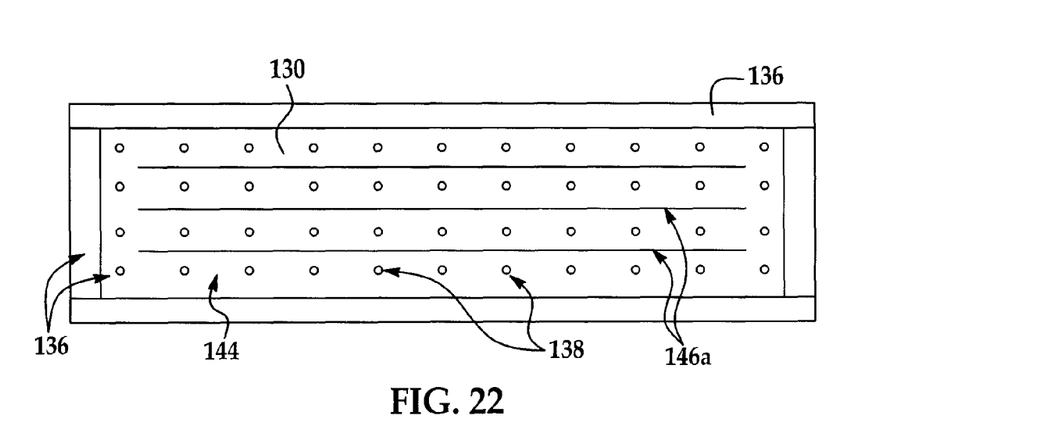
FIG. 22 is a plan view of one of the layers of the device shown in FIGS. 20 and 21.
Figure 23:
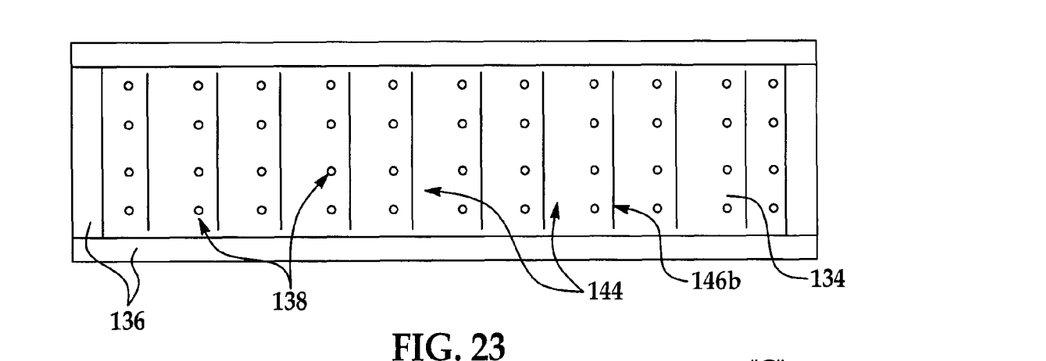
FIG. 23 is a plan view of another layer of the device shown in FIGS. 20 and 21.

As best seen in FIGS. 22 and 23, the entire periphery 136 of the device 128 may be consolidated using any of several common techniques, including ultrasonic welding. Additionally, the layers 130-134 are welded to each other at multiple spots 138 thereby leaving small gaps 148 (FIG. 21) between the layers 130-134 that define wick areas 144 shown in FIGS. 21-23. During the formation of the layers 130-134, vapor tubes 146 shown in FIG. 21 may be integrally formed in at least certain of the layers 130-134. In one embodiment, shown in FIGS. 23 and 24, the vapor tubes 146a in one layer 130 may extend generally orthogonal to the vapor tubes 146b in another layer 134. The vapor tubes 146 may also be fabricated by preforming the foil layers 130-134 before they are welded together.

The wick areas 144 shown in FIGS. 21 and 22 function to ensure that a working fluid may flow freely between the layers 130-134 via capillary action. The capillary action forces pull the fluid along through the wick areas 144. The heat within the device 128 causes the working fluid to vaporize, and the vapors are allowed to escape from the wick areas 144 through the vapor tubes 146. The vapor then condenses along cooler locations within the vapor tubes 146, thereby returning to its fluid state. Although the vapor tubes 146 are shown as being arranged in two orthogonal directions, more than two directions are possible. The working thermal fluids used in the device 128 should have low pressures relative to the strength of the foils used to form the layers 130-134.

Figure 24:
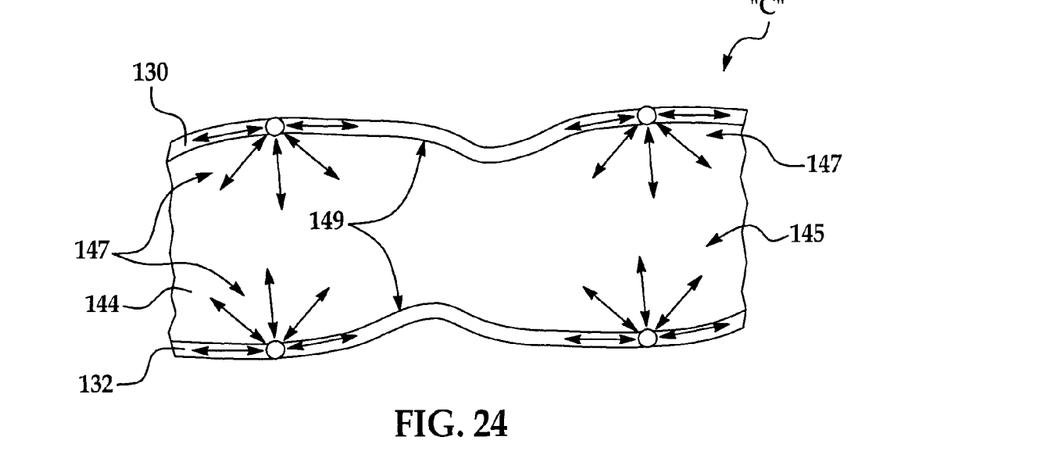
FIG. 24 is an enlarged view of the area designated as "C" in FIG. 21.

As shown in FIG. 24, wick action is created in the wick areas 144 by surface tension 147 of fluid 145 on the faces 149 of the layer 130-132. This surface tension 147 and the wicking action may be enhanced by texturing the surface 149 of the layers 130-132, as for example and without limitation, by sanding. The flexibility of the layers 130-134 provides advantageous pressure vs. temperature properties since the volume is not fixed as in a conventional heat pipe.

The flexibility of the thermal management device 128 may be advantageously employed in some applications to mitigate assembly challenges created by tolerances, differential expansion of materials and other variations which may not be able to be accommodated by a rigid thermal management device 30. The thermal management device 128 may be bonded to a local area of a PCB assembly (not shown) or electronic components (not shown) using a flexible, thermal adhesive. The device 128 may also be mounted for example and without limitation, on a top area of a high powered electronic component (not shown) in order to transport heat from the device 128 to an attached circuit board (not shown). The flexible thermal management device 128 may also be combined to form larger, highly conductive surfaces for a variety of applications where it may be desirable to mitigate large thermal gradients.

Figure 25:
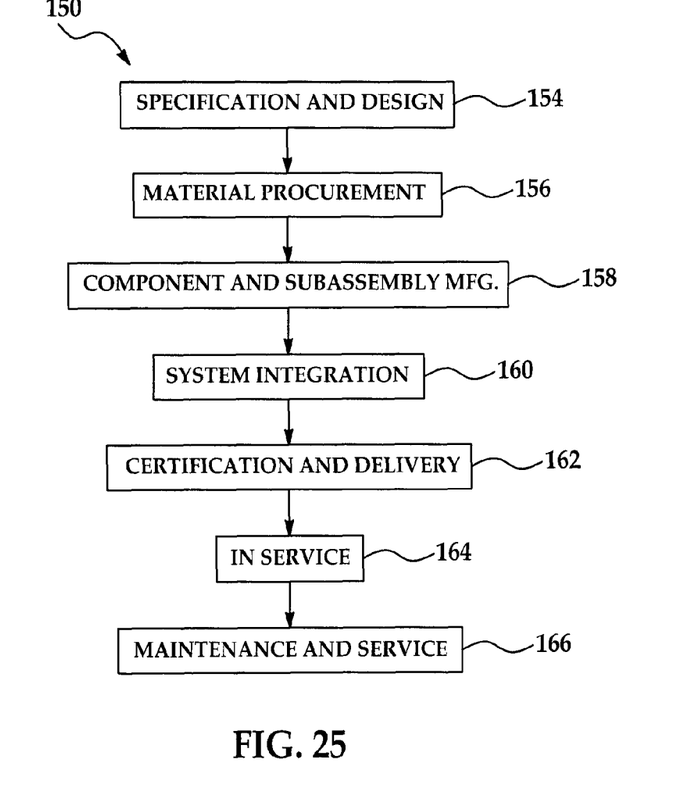
FIG. 25 is a flow diagram of aircraft production and service methodology.
Figure 26:
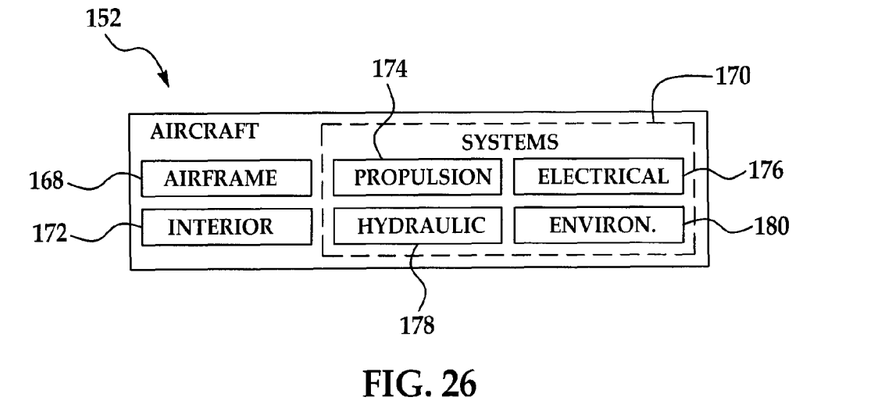
FIG. 26 is a block diagram of an aircraft.

Embodiments of the disclosure may find use in a variety of potential applications, particularly in the transportation industry, including for example, aerospace, marine and automotive applications. Thus, referring now to FIGS. 25 and 26, embodiments of the disclosure may be used in the context of an aircraft manufacturing and service method 150 as shown in FIG. 25 and an aircraft 152 as shown in FIG. 26. During pre-production, exemplary method 150 may include specification and design 154 of the aircraft 152 and material procurement 156. During production, component and subassembly manufacturing 158 and system integration 160 of the aircraft 152 takes place. Thereafter, the aircraft 152 may go through certification and delivery 162 in order to be placed in service 164. While in service by a customer, the aircraft 152 is scheduled for routine maintenance and service 166 (which may also include modification, reconfiguration, refurbishment, and so on).

Each of the processes of method 150 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 26, the aircraft 152 produced by exemplary method 150 may include an airframe 168 with a plurality of systems 170 and an interior 172. Examples of high-level systems 170 include one or more of a propulsion system 174, an electrical system 176, a hydraulic system 178, and an environmental system 180. Any number of other systems may be included. Although an aerospace example is shown, the principles of the disclosure may be applied to other industries, such as the marine and automotive industries.

Systems and methods embodied herein may be employed during any one or more of the stages of the production and service method 150. For example, components or subassemblies corresponding to production process 158 may be fabricated or manufactured in a manner similar to components or subassemblies produced while the aircraft 152 is in service. Also, one or more apparatus embodiments, method embodiments, or a combination thereof may be utilized during the production stages 158 and 160, for example, by substantially expediting assembly of or reducing the cost of an aircraft 152. Similarly, one or more of apparatus embodiments, method embodiments, or a combination thereof may be utilized while the aircraft 152 is in service, for example and without limitation, to maintenance and service 166.

Although the embodiments of this disclosure have been described with respect to certain exemplary embodiments, it is to be understood that the specific embodiments are for purposes of illustration and not limitation, as other variations will occur to those of skill in the art.

What is claimed is:

1. A thermal management device comprising:
a one-piece monolithic body having at least one embedded channel for channeling heat away from a heat source, said at least one embedded channel surrounded by fluid impervious consolidated layers of thermally conductive material comprising said monolithic body, said consolidated layers of thermally conductive material comprising multiple solid interfaces that are metallurgically bonded, wherein the at least one embedded channel is formed within a first layer of material that is sandwiched between two outer layers of material, wherein the first layer of material and the two outer layers of material are different materials, wherein the first layer of material and the two outer layers of material are fused into the one-piece monolithic body, and wherein the monolithic body includes a second embedded channel for channeling heat away from the heat source, the first and second channels forming a zigzag pattern and being generally coextensive with each other.

2. The device of claim 1, wherein:
the body includes first and second opposite edges, and the channel includes first and second portions respectively extending along the first and second edges for channeling heat from the body to the first and second edges.

3. The device of claim 1, wherein the channel includes internal walls and thermal fins integral with the walls for enhancing heat transfer from the body to the channel.

4. The device of claim 1, wherein the body is a plate having opposite faces upon which the heat source may be mounted.

5. An electronics chassis having thermal management, comprising:
a one-piece monocoque body having at least one integral channel therein for carrying heat away from an electronic assembly, said at least one integral channel surrounded by fluid impervious consolidated layers of thermally conductive material comprising said monocoque body, said consolidated layers of thermally conductive material comprising multiple solid interfaces that are metallurgically bonded, wherein the at least one integral channel is formed within a first layer of material that is sandwiched between two outer layers of material, wherein the first layer of material and the two outer layers of material are different materials, wherein the first layer of material and the two outer layers of material are fused into the monocoque body, and wherein the monocoque body includes integrally formed inlet and outlet openings coupled with the channel for directing a flow of a heat exchange fluid into and out of the monocoque body.

6. The electronics chassis of claim 5, wherein:
the monocoque body includes an edge, and
the channel includes portions extending along the edge of the monocoque body for channeling heat from the electronic assembly to the edge of the monocoque body.

7. The electronic chassis of claim 5, wherein the monocoque body includes integrally formed thermal fins within the channel for enhancing heat transfer from the body to the channel.

8. The electronic chassis of claim 5, wherein the monocoque body includes consolidated layers of at least one of:
aluminum,
copper,
manganese,
nickel,
gold,
silver, and
titanium.

9. The electronic chassis of claim 5, further comprising:
a mounting receptacle, and
wherein the monocoque body includes a face configured to have a second electronics assembly mounted thereon, and an edge extending generally traverse to the face and received within the mounting receptacle.

10. An electronic device having thermal management, comprising:
a one-piece monolithic chassis; and
at least one circuit board mounted on the chassis, said at least one circuit board comprising electronic devices generating heat,
wherein the monolithic chassis includes integral channels for carrying heat away from the at least one circuit board, each of said integral channels surrounded by fluid impervious consolidated layers comprising solid interfaces of thermally conductive material comprising said monolithic chassis, said consolidated layers of thermally conductive material being metallurgically bonded, wherein the integral channels are formed within a first layer of material that is sandwiched between two outer layers of material, wherein the first layer of material and the two outer layers of material are different materials, wherein the first layer of material and the two outer layers of material are fused into the one-piece monolithic body, and wherein the monolithic chassis includes integrally formed inlet and outlet openings coupled with the channel integral channels directing a flow of a heat exchange fluid into and out of the monolithic chassis.

11. A thermal management device comprising:
a generally flat one piece monolithic body including solid interfaces of metallurgically bonded layers of a metal foil, and a pair of faces each having a means to contact a heat source; and,
open fluid channels integral with the body, including thermal fins in the channels for enhancing the transfer of heat from the body into the channels, the channels including aligned stretches extending along edges of the flat monolithic body defining heat extraction zones where heat may be extracted from the body, said fluid channels surrounded by said metallurgically bonded layers of metal foil, said bonded layers of metal foil impervious to fluid, wherein the open fluid channels are formed within a first layer of material that is sandwiched between the metallurgically bonded layers of metal foil wherein the first layer of material and the two outer layers of material are different materials, and wherein the first layer of material and the two outer layers of material are fused into the monolithic body.

12. The thermal management device of claim 1 wherein a boundary between the first layer of material and the two layers of material is indistinct as a result of being fused.

13. The thermal management device of claim 12 wherein the one-piece monolithic body includes holes, and wherein the at least one embedded channel has an irregularly shaped layout geometry including arcuate sections that substantially follow a periphery of the holes.

14. The electronics chassis of claim 5 wherein a boundary between the first layer of material and the two layers of material is indistinct as a result of being fused.

15. The thermal management device of claim 14 wherein the one-piece monolithic body includes holes, and wherein the at least one embedded channel has an irregularly shaped layout geometry including arcuate sections that substantially follow a periphery of the holes.

16. The electronic assembly of claim 10 wherein a boundary between the first layer of material and the two layers of material is indistinct as a result of being fused.

17. The thermal management device of claim 16 wherein the one-piece monolithic body includes holes, and wherein the at least one embedded channel has an irregularly shaped layout geometry including arcuate sections that substantially follow a periphery of the holes.

18. The thermal management device of claim 11 wherein a boundary between the first layer of material and the two layers of material is indistinct as a result of being fused, wherein the one-piece monolithic body includes holes, and wherein the at least one embedded channel has an irregularly shaped layout geometry including arcuate sections that substantially follow a periphery of the holes.

* * * * *

UNITED STATES PATENT AND TRADEMARK OFFICE
CERTIFICATE OF CORRECTION

PATENT NO. : 9,500,416 B2
APPLICATION NO. : 12/131081
DATED : November 22, 2016
INVENTOR(S) : Nguyen et al.

Page 1 of 1

It is certified that error appears in the above-identified patent and that said Letters Patent is hereby corrected as shown below:

In the Claims

Column 9, Line 47, change "the channel integral" to -- the integral --

Column 10, Line 17-18, change "the two outer layers of material" to -- the metallurgically bonded layers of metal foil --
     Line 45, change "the two layers of material" to -- the metallurgically bonded layers of metal foil --

Signed and Sealed this
Sixth Day of February, 2018

Joseph Matal
*Performing the Functions and Duties of the*
*Under Secretary of Commerce for Intellectual Property and*
*Director of the United States Patent and Trademark Office*